United States Patent [19]

Asai et al.

[11] Patent Number: 4,649,635

[45] Date of Patent: Mar. 17, 1987

[54] APPARATUS FOR POSITIONING SUBSTRATES OF DIFFERENT SIZES OF PRINTED-WIRING BOARDS

[75] Inventors: Koichi Asai, Nagoya; Mamoru Tsuda, Okazaki; Jiro Kodama, Nagoya, all of Japan

[73] Assignee: Fuji Machine Mfg. Co., Ltd., Aichi, Japan

[21] Appl. No.: 819,021

[22] Filed: Jan. 15, 1986

[30] Foreign Application Priority Data

Jan. 21, 1985 [JP] Japan .................................. 60-8807

[51] Int. Cl.⁴ .............................................. H05K 3/30
[52] U.S. Cl. ....................................... 29/759; 29/741; 74/479
[58] Field of Search .......................... 29/759, 739-741; 74/89.15, 479; 33/1 M; 108/143

[56] References Cited

U.S. PATENT DOCUMENTS

4,116,376  9/1978  Delorme et al. ................. 29/741 X

*Primary Examiner*—Carl E. Hall
*Attorney, Agent, or Firm*—Parkhurst & Oliff

[57] ABSTRACT

An apparatus for positioning printed-wiring substrates of different sizes comprising: an X-Y table having a movable device movable along X and Y axes; a pair of Y-axis positioning members which are disposed on the movable device and relatively movably spaced from each other along the Y axis, so as to be engageable with opposite parallel sides of the substrate parallel to the X axis, for positioning the substrate along the Y axis; an X-axis positioning member provided on the movable device and engageable with the substrate to position the substrate along the X axis; a first engagement member provided on at least one of the the Y-axis positioning members; a second engagement member which is fixed in position in the Y-axis direction; and a driving device for moving the first and second engagement members toward each other along an axis perpendicular to the Y axis, and effecting engagement of the first and second engagement members with each other, to thereby hold the above-indicated at least one Y-axis positioning member fixed in the Y-axis direction, and permit a change in relative position between the at least one Y-axis positioning member and the movable device along the Y-axis through a movement of the movable device along the Y axis.

8 Claims, 14 Drawing Figures

APPARATUS FOR POSITIONING SUBSTRATES OF DIFFERENT SIZES OF PRINTED-WIRING BOARDS

BACKGROUND OF THE INVENTION

1. Field of the Art

The present invention relates generally to an apparatus capable of positioning circuit substrates of different sizes of printed-wiring boards, and more particularly to such a positioning apparatus having a pair of positioning members for positioning the substrates, wherein a distance between the positioning members can be efficiently and accurately changed to suit the specific size of the substrate that is to be positioned.

2. Related Art Statement

In the art of drilling holes in a circuit substrate of a printed-wiring board, or performing other operations on the substrate, or placing various electronic circuit components on the substrate, it is a general practice to place the circuit substrate on an NC table (numerically-controlled table) which is movable along X and Y axes perpendicular to each other. Since the substrate must be positioned on the NC table with high precision, the NC table is usually equipped with a substrate positioning device for accurate positioning of the substrate on the table.

An example of a substrate positioning device of the type indicated above comprises a mounting or support member disposed on the NC table and movable along X and Y axes perpendicular to each other, a pair of Y-axis positioning members which are disposed parallel to the X axis and at least one of which is movable toward and away from the other along the Y axis so as to be engageable with opposite parallel sides of the substrate parallel to the X axis to thereby position the substrate in the Y-axis direction, and an X-axis positioning member which is engageable with the substrate to position the substrate in the Y-axis direction. This type of positioning device is therefore capable of positioning different sizes of the circuit substrates.

In the substrate positioning device indicated above, the distance between the Y-axis positioning members is changed depending upon the sizes of the substrates by the operator, by moving the positioning members toward or away from each other in the Y-axis direction, directly by hand, or by manipulating suitable mechanical means such as a screw-and-nut feed arrangement.

PROBLEMS SOLVED BY THE INVENTION

However, the above-indicated methods of changing the distance between the positioning members suffer inconveniences. More specifically, where the positioning members are moved directly by hand, considerable efforts and time are required to accurately establish an intended distance between the positioning members suitable for the specific size of a substrate to be positioned. Where a feed screw or other suitable mechanical means is employed, the substrate positioning device is complicated in construction due to additional components of the mechanical means, and expensive particularly when high positioning accuracy is required for establishing the desired spacing between the positioning members.

SUMMARY OF THE INVENTION

It is accordingly an object of the present invention to provide a substrate positioning apparatus capable of positioning circuit substrates of printed-wiring boards having different sizes, which apparatus comprises a simple arrangement for accurately and efficiently changing a distance between a pair of Y-axis positioning members to suit the specific size of the substrate to be positioned.

According to the present invention, there is provided a substrate positioning apparatus for positioning circuit substrates of different sizes of printed-wiring boards, comprising an X-Y table having movable means movable along an X axis and a Y axis perpendicular to the X axis, a pair of Y-axis positioning members disposed on the movable means and spaced from each other in the Y-axis direction to position the substrate in the Y-axis direction, and an X-axis positioning member provided on the movable means and engageable with the substrate to position the substrate in the X-axis direction. At least one of the Y-axis positioning members is movable along the Y axis so that the Y-axis positioning members are movable toward and away from each other, so that the Y-axis positioning members are engageable with opposite parallel sides of the circuit substrate which are parallel to the X axis, thereby positioning the substrate in the Y-axis direction. The instant substrate positioning apparatus further comprises a first engagement member provided on the above-indicated at least one Y-axis positioning member, a second engagement member which is fixed in position in the Y-axis direction, and a first driving device for moving the first and second engagement members relative to each other in a direction perpendicular to the Y axis, and for effecting engagement of the first and second engagement members with each other, to thereby hold the at least one Y-axis positioning member fixed in the Y-axis direction, and permit a change in relative position between the at least one Y-axis positioning member and the movable means in the Y-axis direction through movement of the movable means in the Y-axis direction.

In the substrate positioning apparatus of the present invention constructed as described above, the distance between the Y-axis positioning members in the Y-axis direction can be changed or adjusted in a process which comprises the steps of: effecting engagement between the first and second engagement members by activating the first driving device, to hold the above-indicated at least one movable Y-axis positioning member fixed in position in the Y-axis direction; then moving the movable means in the Y-axis direction relative to the thus fixed movable Y-axis positioning member, to thereby change a relative position between the movable means and the fixed movable Y-axis positioning member, so that the distance between the pair of Y-axis positioning members is adjusted to suit the size of the substrate; and subsequently releasing the engagement of the first and second engagement members.

As is apparent from the above description, the adjustment of the distance between the Y-axis positioning members in the instant positioning apparatus is carried out by utilizing accurate positioning capability of the movable means which is accurately positioned by the X-Y table provided for positioning the substrate. This manner of changing the distance between the Y-axis positioning members permits faster and more accurate positioning of the Y-axis positioning members, than the conventionally practiced manual positioning by hand or by means of a feed screw arrangement or other mechanical feed system. Further, the positioning steps for positioning the Y-axis positioning members in the present apparatus can be automated, without the provision of an expensive additional driving device for positioning the Y-axis positioning member in the Y-axis direction for the purpose of changing the distance between the positioning members. Thus, the present invention provides a simple and inexpensive arrangement for adjusting the above-indicated distance to meet various sizes of the substrates to be positioned.

The at least one movable Y-axis positioning member is normally fixed to the movable means. For this end, suitable means such as frictional clamping means or a positive clamp mechanism may be provided. In the case where frictional clamping means is employed, a frictional force is applied between the movable Y-axis positioning member and the movable means, so that the frictional force does not permit a relative displacement between the movable Y-axis positioning member and the movable means when the movable means is moved in the Y-axis direction during normal positioning operations for positioning the substrate, but permits the relative displacement when the movable means is moved in the Y-axis direction with the movable Y-axis positioning member held fixed through the engagement of the first and second engagement members as previously described. Where a positive clamp mechanism is used, the movable Y-axis positioning member is normally positively clamped to the movable means by the clamp mechanism. Therefore, it is necessary to automatically or manually unclamp the movable Y-axis positioning member, before the movable means is moved relative to the movable Y-axis positioning member to change the distance between the Y-axis positioning members.

In the above instance where the clamp mechanism is provided according to an advantageous embodiment of the invention, the clamp mechanism may be provided on the at least one movable Y-axis positioning member, such that the clamp mechanism is operable between a clamp position in which the movable Y-axis positioning member is fixed relative to the movable means, and an unclamp position in which the movable Y-axis positioning member is unclamped. The clamp mechanism is normally placed in the clamp position. In the present advantageous embodiment, the positioning apparatus further comprises an unclamping member which is fixed in position in the Y-axis direction, and a second driving device for moving the unclamping member and the clamp mechanism relative to each other, to cause the clamp mechanism to be brought into the unclamp position by the unclamping member.

In the above advantageous embodiment wherein the clamp mechanism is provided, the at least one movable Y-axis positioning member is normally clamped by the clamp mechanism to the movable means. When the distance between the Y-axis positioning members is changed by moving the movable means, the second driving device is activated to move the unclamping member and the clamp mechanism toward each other so that the clamp mechanism is brought into its unclamp position by the unclamping member. In the meanwhile, the at least one movable Y-axis positioning member is fixed in the Y-axis direction due to the first and second engagement members engaging each other. Subsequently, the movable means is moved along the Y axis to change the Y-axis position of the at least one movable Y-axis positioning member relative to the movable means, so as to establish a suitable distance between the Y-axis positioning members corresponding to the size of the substrate. Then, the first driving device is activated to disengage the first and second engagement members away from each other, while the second driving device is activated to place the clamp mechanism in its clamp position. In this condition, the movable Y-axis positioning member and the movable means are movable together along the X and Y axes, with the former clamped to the latter, for normal positioning of the substrate.

According to the above-described advantageous embodiment, therefore, the distance between the Y-axis positioning members can be changed readily and precisely, with a simple and inexpensive arrangement as previously described. In addition, the movable Y-axis positioning member is firmly clamped to the movable means by the clamp mechanism, whereby the positioning accuracy of the substrate is improved. Further, the clamp mechanism is automatically set in its unclamp position by the unclamping member by activating the second driving device, thus permitting a relative displacement of the movable means and the movable Y-axis positioning member for adjusting the distance between the Y-axis positioning members. Thus, it is not necessary to manually unclamp the movable Y-axis positioning member from the movable means According to a preferred form of the above embodiment, the first driving device is adapted to serve also as the second driving device for bringing the clamp mechanism into its unclamp position. More specifically, the first driving device is designed to move both of the first engagement member and the clamp mechanism, whereby the first and second engagement members engage each other while at the same time the clamp member is set to its unclamp position. In this form of the invention, the positioning apparatus is simplified.

According to a further preferred form of the above embodiment, the second engagement member is adapted to serve also as the unclamping member, rather than a separate member is provided to exclusively serve as the unclamping member. In this case, too, the positioning apparatus is accordingly simplified.

According to another advantageous embodiment of the invention, the X-axis positioning member is movable in the X-axis direction, and the positioning apparatus further comprises a third engagement member provided on the X-axis positioning member, a fourth positioning member which is fixed in position in the X-axis direction, and a third driving device for moving the third and fourth engagement members relative to each other in a direction perpendicular to the X axis, and for effecting engagement of the third and fourth engagement members with each other, to thereby hold the X-axis positioning member fixed in the X-axis direction, and permit a change in relative position between the X-axis positioning member and the movable means in the X-axis direction through a movement of the movable means in the X-axis direction.

In the above embodiment, the relative X-axis position of the X-axis positioning member and the movable means can be changed when the movable means is moved along the X axis while the X-axis positioning member is fixed with the third and fourth engagement members in engagement with each other, as well as the relative Y-axis position of the movable Y-axis positioning member and the movable means can be changed when the movable means is moved along the Y axis while the movable Y-axis positioning member is fixed with the first and second engagement members in engagement with each other, as previously described.

In the above embodiment, therefore, it is possible not only to change the distance between the Y-axis positioning members for Y-axis positioning of the substrate, but also to change the X-axis position of the X-axis positioning member for positioning the substrate in the X-axis direction. These positionings of the movable Y-axis positioning member and the X-axis positioning member are achieved by utilizing the movements of the movable means which are moved by the X-Y table along the X and Y axes. Accordingly, the positioning apparatus according to this embodiment is readily and accurately adaptable to not only the X-axis dimension but also the Y-axis dimension of the substrate to be positioned.

Although the above embodiment includes the first and second engagement members and the first driving device for changing the distance between the Y-axis positioning members, it is possible that only the third and fourth engagement members and the second driving device for the X-axis positioning member may be provided without the previously described arrangement for changing the Y-axis distance of the Y-axis positioning members.

Like the movable Y-axis positioning member, the X-axis positioning member may be normally fixed to the movable means by suitable clamp means similar to that used for the movable Y-axis positioning member.

BRIEF DESCRIPTION OF THE DRAWINGS

The above and optional objects, features and advantages of the present invention will be better understood from reading the following detailed description of a preferred embodiment of the invention, when considered in conjunction with the accompanying drawings, in which.

DETAILED DESCRIPTION OF THE PREFERRED EMBODIMENT

To further clarify the concept of the present invention, a preferred embodiment of the invention will be described, referring to the accompanying drawings.

Figure 1:
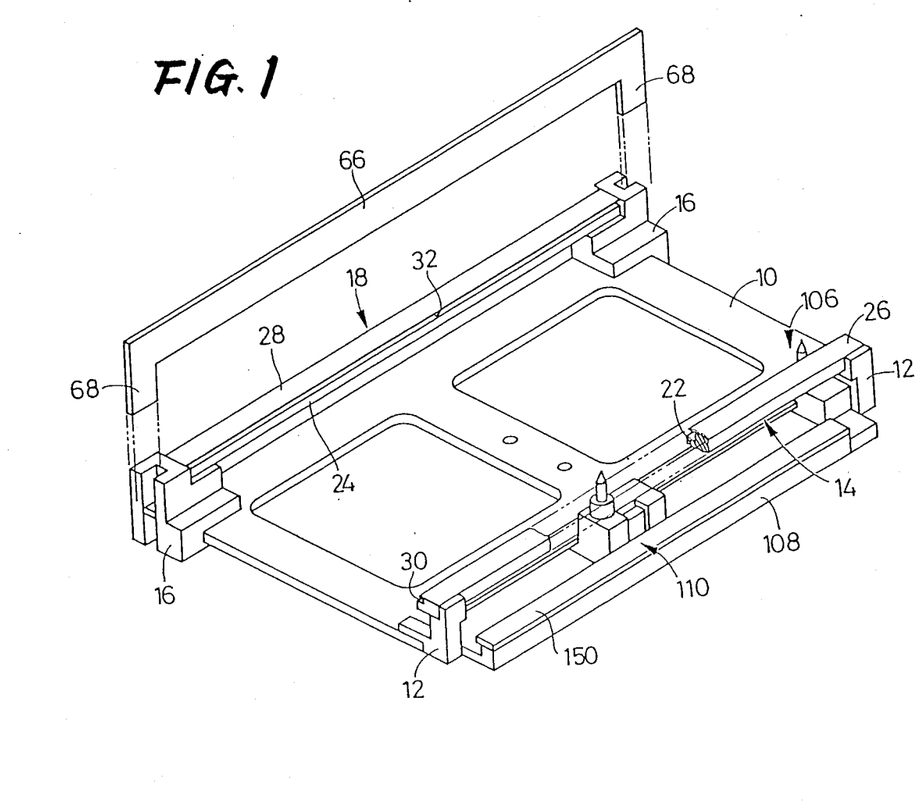
FIG. 1 is an illustrative fragmentary view in perspective of one embodiment of a substrate positioning apparatus of the present invention.

Referring first to an illustrative fragmentary perspective view of FIG. 1, there is shown a positioning apparatus for positioning a circuit substrate 20 of a printed-wiring board. This substrate positioning apparatus is illustrated in greater detail in a plan view of FIG. 2, a fragmentary rear elevational view of FIG. 3, and a cross sectional view taken along line VI—VI of FIG. 2. In these figures, reference numeral 10 designates a support member in the form of a rectangular support plate which supports a pair of stationary bracket 12, 12 and a pair of movable brackets 16, 16. The stationary brackets 12, 12 are fixed to the front left and right corners of the rectangular support plate 10, and supports a stationary guide 14 attached thereto. The movable brackets 16, 16 slidably engage the left and right sides of the support plate 10, and supports a movable guide 18 fixed thereto. Thus, the movable brackets 16, 16 and the movable guide 18 are movable along a Y axis toward and away from the stationary brackets 12, 12 and the stationary guide 14, whereby the stationary and movable guides 14, 18 are engageable with the opposite front and rear sides of the support plate 10 parallel to an X axis perpendicular to the Y axis. Thus, the stationary brackets 12, 12 and the stationary guide 14 constitute a stationary Y-axis positioning member while the movable brackets 16, 16 and the movable guide 18 constitute a movable Y-axis positioning member. That is, the stationary and movable Y-axis positioning member form a pair of Y-axis positioning members for positioning the substrate 20 in the Y-axis direction, as well as for supporting the substrate 20. The stationary and movable guides 14, 18 serve to guide the substrate 20 in the X-axis direction (left and right directions in FIG. 2). The stationary guide 14 consists of an elongate guide bar 22 which has a rectangular shape in transverse cross section and extends parallel to the X-axis, and a retainer plate 24 attached to the top surface of the guide bar 22. Similarly, the movable guide 18 consists of an elongate guide bar 24 and a retainer plate 28 parallel to the guide bar 22.

The guide bars 22, 24 are attached at their opposite ends to the top surfaces of the corresponding stationary and movable brackets 12, 12, 16, 16, so that the guide bars 22, 24 are located a suitable distance above the top surface of the support plate 10. The opposed side surfaces of the guide bars 22, 24 have a pair of opposed cutouts 30, 32 at their upper parts. These cutouts 30, 32 cooperate with the retainer plates 26, 28, respectively, to define a pair of guide grooves which are engageable with the front and rear sides of the substrate 20 parallel to the X axis. Since the stationary and movable guides 14, 18 in this specific embodiment are adapted to permit the substrate 20 to be slidably moved in the X-axis direction, the substrate 20 is positioned roughly in the Y-axis direction.

On the right and left sides of the support plate 10, there are disposed a feed-in device 34 and a feed-out device 36 for feeding the substrate 20 along the X axis toward and away from the support plate 10. Each of the feed-in and feed-out devices 34, 36 has a pair of conveyer belts 38, 40 on which the substrate 20 is placed for loading and unloading via guide plates 42, 44. More specifically, the substrate 20 which has been conveyed to the feed-in end of the feed-in device 34 is slidably moved on the conveyer belts 38, 40 by a loader (not shown) and pushed in between the previously described stationary and movable guides 14, 18. In the meantime, the substrate 20 supported by the guides 14, 18 is slidably moved between the guides 14, 18 by an unloader (not shown), and pulled onto the conveyer belts 38, 40 of the feed-out device 36.

The movable brackets 16, 16 are constructed and disposed in exact symmetric relation with each other with respect to the Y axis. For this reason, only the movable bracket 16 provided on the left side of the support plate 10 will be described in detail referring to FIGS. 5 and 6, and no detailed description of the right bracket 16 will be given.

Figure 2:
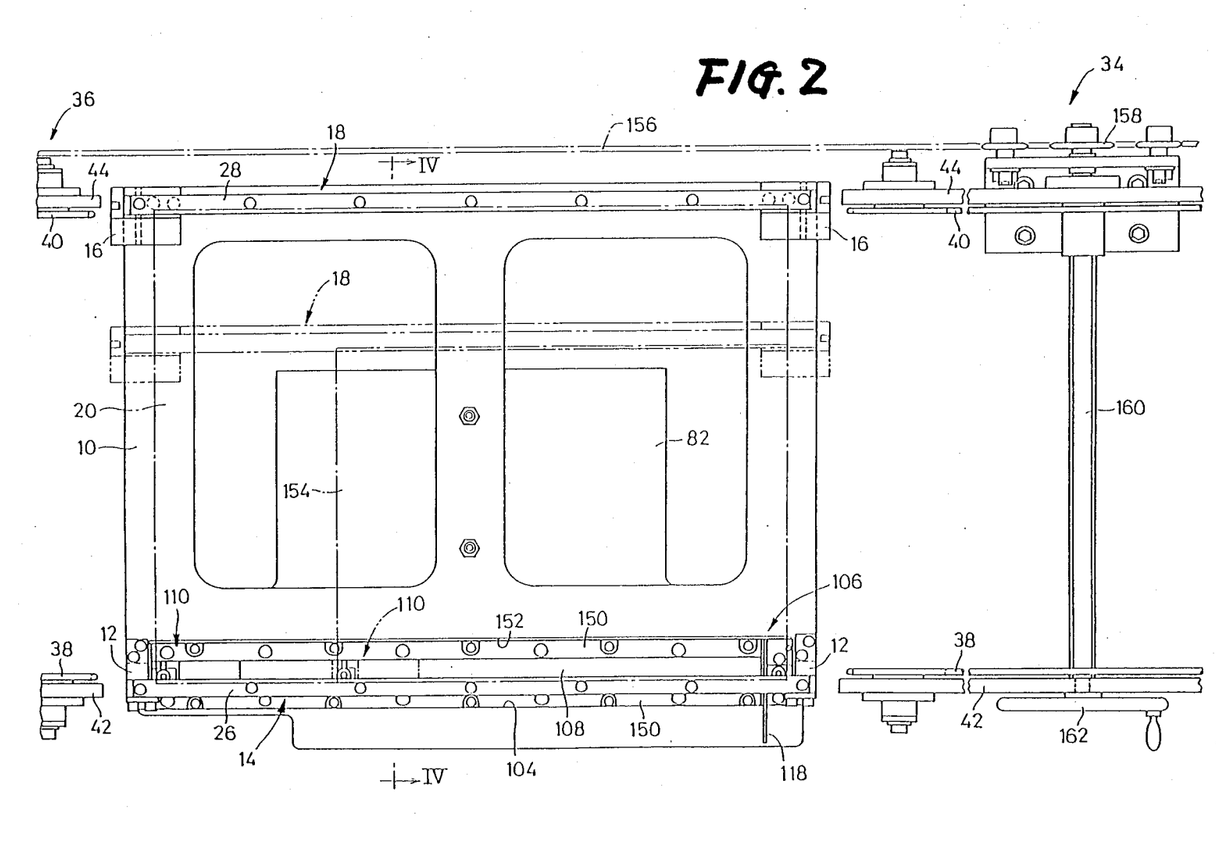
FIG. 2 is a plan view of the positioning apparatus of FIG. 1.
Figure 3:
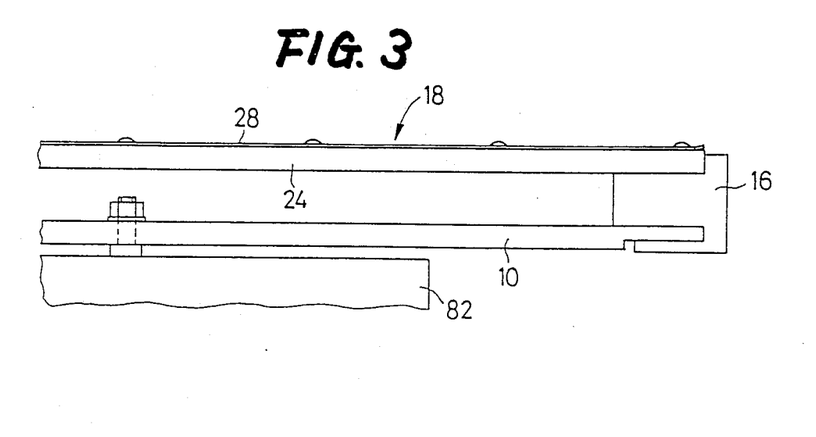
FIG. 3 is a fragmentary rear elevational view of the positioning apparatus.
Figure 5:
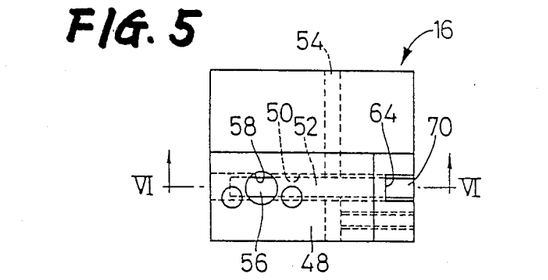
FIG. 5 is a plan view showning one of movable brackets of the positioning apparatus.
Figure 6:
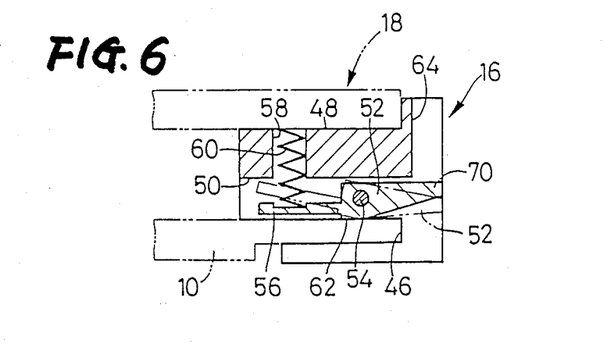
FIG. 6 is a cross sectional view taken along line VI—VI of FIG. 5.

The left movable bracket 16 has in its lower portion a rectangular groove 46, so that the left-hand side end portion of the support plate 10 slidably engages the rectangular groove 46, so as to support the movable bracket 16 along the left side edge of the support plate 10, that is, in the Y-axis direction (perpendicular to the X axis), i.e., in the vertical direction of FIG. 2. In the upper portion of the left movable bracket 16, there is formed a mounting surface 48 parallel to the rectangular groove 46, so that the corresponding end of the movable guide 18 is fixed to the mounting surface 48. Further, the bottom portion of the movable bracket 16 has a rectangular groove 50 which is formed across the groove 46 and so as to extend along the X axis. A clamp lever 52 is received within a portion of the groove 50 above the groove 46. The clamp lever 52 is supported pivotally about a pin 54 which extends along the Y axis. The clamp lever 52 has an operating portion 56 at its one end, which engages one end of a spring 60. This spring 60 is accommodated in a round hole 58 which opens in the mounting surface 48 at its one end and communicates with the rectangular groove 50. With a biasing force of the spring 60, a friction surface 60 of the clamp lever 52 is normally held in pressed contact with the top surface of the support plate 10, whereby the movable bracket 16 is normally held fixed to the support plate, i.e., fixed in position in the Y-axis direction. Since the friction surface 62 is located near the pin 54, the biasing force exerted on the operating portion of the clamp lever 52 is boosted at the friction surface 62 with a predetermined advantage according to the principle of a lever, whereby the friction surface 62 is forced against the support plate 10 with a boosted force. The other end of the spring 60 bears on the lower surface of the movable guide 18 fixed to the mounting surface 48.

In the side surface of the movable bracket 16, there is formed an engagement groove 64 which extends in the vertical direction, i.e., along a Z axis perpendicular to the X and Y axes, and which terminates into the groove 50 discussed above. This engagement groove 64 is adapted to receive corresponding one of two downward extensions 68, 68 of an engagement member 66 (FIG. 1) which is fixed in the Y-axis direction. The thicknesses of the extension 68 and the engagement groove 64 are so determined that the extension 68 fit the groove 64 with only a slight clearance in the Y-axis direction, whereby the movable bracket 16 is fixed in place by the engagement member 66 along the Y axis. The extension 68 serves as a second engagement member which is engageable with the engagement groove 64 in order to hold the movable bracket 16 and the movable guide 18 fixed in position, while a portion of the movable bracket 16 in which the engagement groove 64 is formed serves as a first engagement member which is engageable with the second engagement member 68.

The other end portion 70 of the clamp lever 52 remote from the operating portion 56 at said one end projects into the engagement groove 64, so that when the extension 68 is inserted into the engagement groove 64, the clamp lever 52 is pivoted by the extension 68 against the biasing force of the biasing spring 60 as shown in broken line in FIG. 6. As a result, the movable bracket 16 and the movable guide 18 are allowed to move relative to the support plate 10 in the Y-axis direction. Thus, the clamp lever 52, spring 60, etc. constitute a clamp mechanism for clamping the Y-axis positioning member (16, 18) to the support plate 10, while the extension 68 of the engagement member 66 constitutes an unclamping member for bringing the clamp mechanism into its unclamp position from its clamp position. As is apparent from the above description, the extension 68 serves not only as the second engagement member, but also as the unclamping member for the clamp mechanism.

Figure 4:
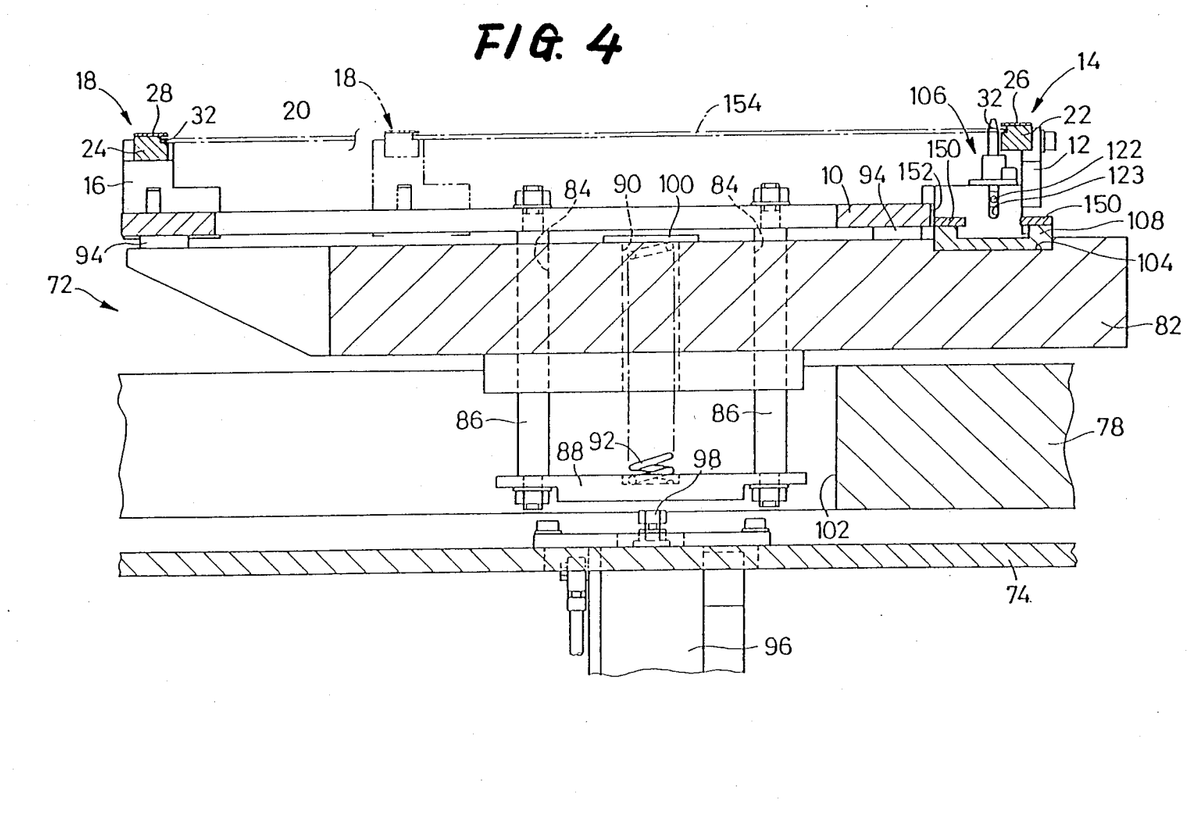
FIG. 4 is an elevational view in cross section taken along line IV—IV of FIG. 2.
Figure 7:
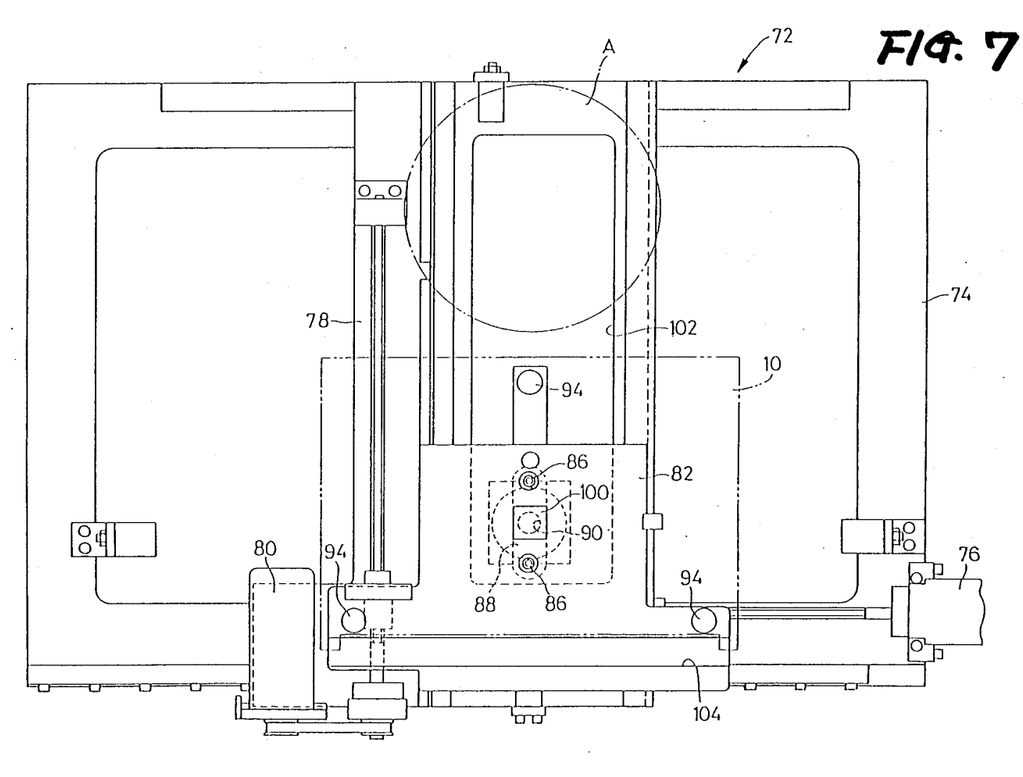
FIG. 7 is a plan view of an NC table, as taken with a support plate on the NC table removed.
Figure 8:
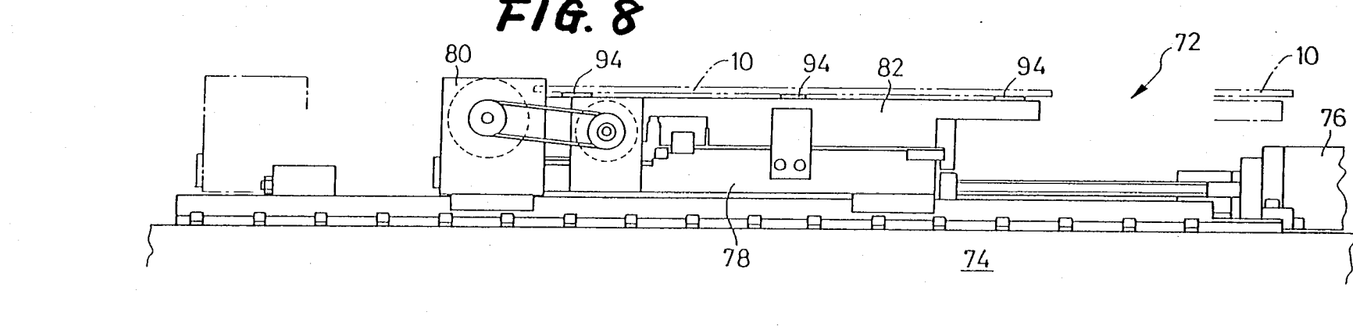
FIG. 8 is a front elevational view of the NC table of FIG. 7.

The support plate 10 which supports the stationary and movable brackets 12, 12, 16, 16 and the stationary and movable guides 14, 18, is mounted on an NC (numerically controlled) table 72 which is moved in the X-Y plane. Described in greater detail referring to a plan view of FIG. 7 and a front elevational view of FIG. 8, the NC table 72 is a well known X-Y table which includes an X-axis slide 78 which is linearly moved along the X axis by a drive motor 76 attached to a base 74, and a Y-axis slide 82 which rests on the X-axis slide 78 and is linearly moved along the Y axis by a drive motor 80. The support plate 10 is supported on the Y-axis slide 82 such that the plate 10 is not movable relative to the Y-axis slide 80 in the X- and Y-axis directions, but is movable relative to the Y-axis slide 80 in the vertical direction, that is, along the Z axis normal to the X and Y axes. Referring back to FIG. 4, the Y-axis slide 82 has a pair of holes 84, 84 formed in the Z-axis direction through its thickness. Through these holes 86, 86 are inserted a corresponding pair of rods 86, 86 such that the rods 86, 86 are slidable relative to the Y-axis slide 82. The support plate 10 is fixed to the top ends of the rods 86, 86 which protrude above the upper surface of the Y-axis slide 82. The lower ends of the rods 86, 86 which protrude below the bottom surface of the Y-axis slide 82 are connected to each other by a connecting bar 88, which is held in biased contact with one end of a spring 92 received in a hole 90 formed in the Y-axis slide 82. With the connecting bar 88 biased downwardly by the spring 92, the support plate 10 is normally held in its lower position in which the bottom surface of the plate 10 abuts on stopper bosses 94 formed on the Y-axis slide 82. Meanwhile, a cylinder 96 is attached to the base 74. A piston rod of the cylinder 96 has an adjusting bolt 98 fixed thereto, so that the adjusting bolt 98 is abutable on the bottom of the connecting bar 88 to elevate the support plate 10 to its upper position which is spaced a predetermined distance from the upper surface of the Y-axis slide 82. When the support plate 10 is placed in its upper position, the cutouts 30, 32 in the movable and stationary guides 14, 18 are substantially aligned with the upper surfaces of the conveyer belts 38, 40 of the feed-in and feed-out devices 34, 36 previously described. In this condition, the substrate 20 can be transferred from the feed-in device 34, and toward the feed-out device 36. When the support plate 10 is placed in its lower position, the support plate 10 and the substrate 20 supported on the plate 10 are located below the level of the feed-in and feed-out devices 34, 36, so that the support plate 10 and the substrate 20 can be moved along the X and Y axes by and together with the Y-axis slide 82, without an interference with the feed-in and feed-out devices 34, 36. Hence, it is possible to position the substrate 20 at desired positions for drilling holes in the substrate 20 or placing electronic component chips at those desired positions. Indicated at A in FIG. 7, is the position at which such drilling or chip placing operations are performed. The upper opening of the hole 90 in the Y-axis slide 82 is closed by a covering member 100 on which the upper end of the spring 92 bears. The X-axis slide 78 is formed with a cutout 102 which extends in the Y-axis direction, so as to permit the lower portions of the rods 86, 86 below the Y-axis slide 82, the connecting bar 88 and other members to be moved with the Y-axis slide 82 in the Y-axis direction.

As is apparent from the foregoing description, the substrate positioning apparatus is provided with movable means which comprises the X-axis slide 78 for moving the substrate 20 along the X axis, the Y-axis slide 82 for moving the substrate 20 along the Y axis, and the support plate 10 for moving the substrate 20 along the Z axis. The NC table 72 provides the X- and Y-axis movements of the substrate 20, and the support plate 10 provides the Z-axis movements of the substrate 20.

In the front portion of the Y-axis slide 82, there is formed a rectangular groove 104 in the X-axis direction. At the right-hand side end portion of this rectangular groove 104 is fixedly disposed a primary positioning member 106. In the remaining portion of the groove 104, there is fixed a guide rail 108 of a U-shape in transverse cross section such that the opening of the U-shape is on the upper side, as clearly shown in FIG. 4. The guide rail 108 slidably supports a secondary positioning member 110 so that the latter is movable in the former in the X-axis direction. These primary and secondary positioning members 106, 110 serves to accurately position the substrate 20 along the X and Y axes, after the substrate 20 has been roughly positioned along the Y-axis with the stationary and movable guides 14, 18.

Figure 9:
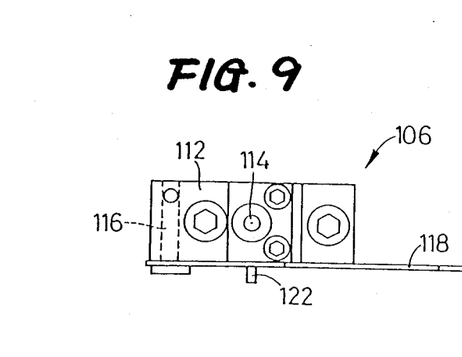
FIG. 9 is a plan view of a primary positioning member of the positioning apparatus.
Figure 10:
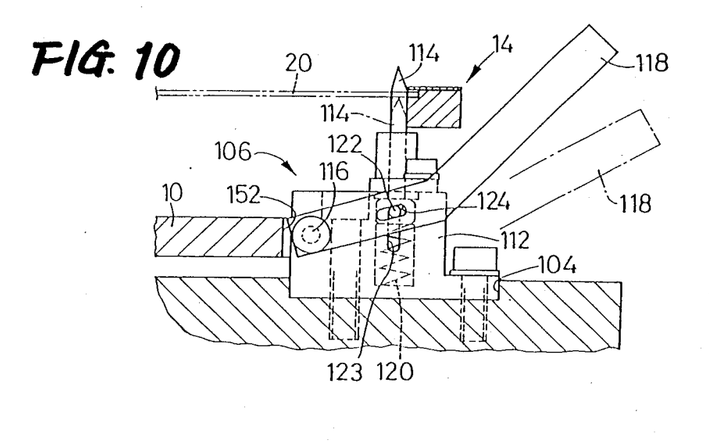
FIG. 10 is a cross sectional view of the primary positioning member mounted on a Y-axis slide of the NC table.

As illustrated in FIGS. 9 and 10, the primary positioning member 106 comprises a positioning pin 114 which projects upward from a block 112 fixed in the rectangular groove 104, and further comprises a dog plate 118 which is supported pivotally about a pin 116 fixed to a side surface of the block 112. The positioning pin 114 is normally held by a spring 120 in its upper position of FIG. 10. In this upper position, the tip of the positioning pin 114 is lower than the upper surface of the substrate 20 which is supported by the stationary and movable guides 14, 18 while the support plate 10 is in its upper position. When the support plate 10 is lowered to its lower position, the positioning pin 114 is inserted through a positioning hole formed in the substrate 20 if the substrate 20 transferred from the feed-in device 34 is correctly positioned. However, if the substrate 20 is not correctly positioned, the positioning pin 114 is pushed down by the substrate 20 into the block 112 against the biasing action of the spring 120, as indicated in broken line in FIG. 10, when the support plate 10 is lowered to its lower position.

The positioning pin 114 is formed with a projection 122 at its lower portion. This projection 122 extends out of the block 112 through a cutout 123 formed in the block 112, and engages an elongate hole 124 formed in an intermediate portion of the dog plate 118. The cutout 123 formed in the block 112 is dimensioned so that the projection 122 is movable in the vertical direction when the pin 114 is moved. When the pin 114 is pushed down by the substrate 20 into the block 112 due to misalignment of the positioning hole in the substrate 20 with the pin 114, the dog plate 118 is pivoted about the pin 116 as the projection 122 is lowered. This pivotal movement of the dog plate 118 is used to activate a limit switch (not shown) which generates a signal to stop the operation of the positioning apparatus due to misalignment of the substrate 20.

Figure 11:
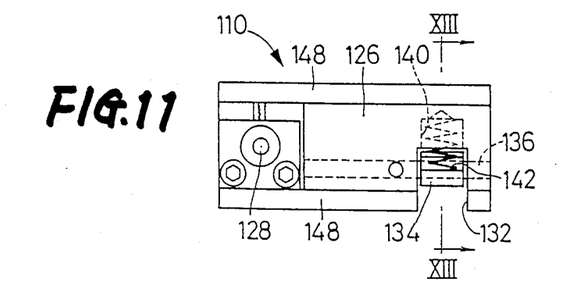
FIG. 11 is a plan view of a secondary positioning member of the positioning apparatus.
Figure 12:
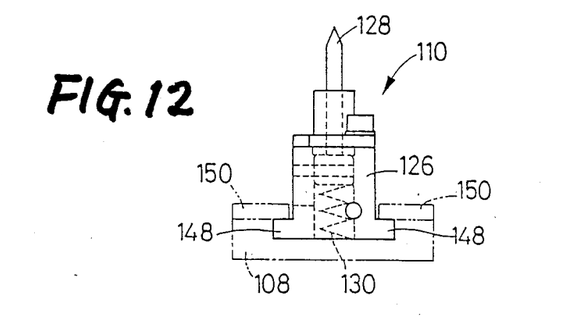
FIG. 12 is a left side elevational view of the secondary positioning member of FIG. 11.
Figure 13:
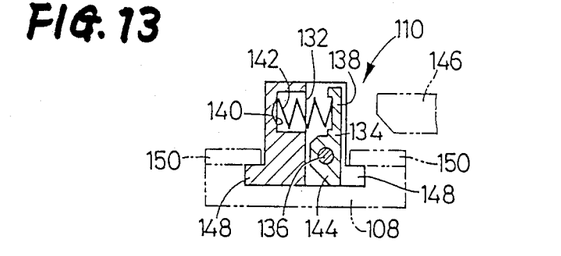
FIG. 13 is an elevational view in cross section taken along line XIII—XIII of FIG. 11.

As depicted in FIGS. 11 through 13, the secondary positioning member 110 comprises a positioning pin 128 protruding above a block 126 which slidably fits the guide rail 108. This positioning pin 128 is normally held by a spring 130 in its upper position. Like the upper position of the positioning pin 114 of the primary positioning member 106, the upper position of the positioning pin 128 is determined such that the tip of the positioning pin 128 is lower than the upper surface of the substrate 20 supported by the support plate 10 in its upper position. When the support plate 10 is lowered to its lower position, the positioning pin 128 is inserted through another positioning hole formed in the substrate 20, thus cooperating with the positioning pin 114 of the primary positioning member 106 to position the substrate 20 with high precision. However, if the substrate 20 is not correctly positioned, the positioning pin 128 is pushed down by the substrate 20 into the block 126 against the biasing action of the spring 130.

Figure 14:
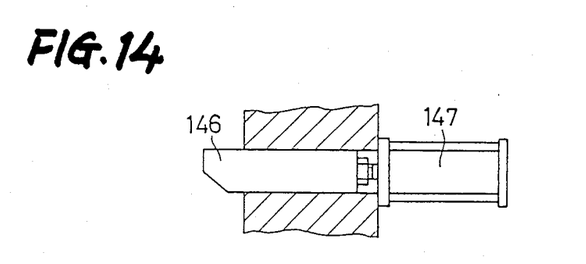
FIG. 14 is a view showing an unclamping member for unclamping the secondary positioning member of FIG. 11 to position the same positioning member, and further showing a cylinder to activate the unclamping member.

In the front portion of the block 126, i.e., on the right side of the block 126 as viewed in FIG. 13, there is formed a vertical groove 132 in which is supported a clamp lever 134 pivotally about a pin 136. A hole 140 is formed in the block 126 such that the hole 140 opens in the groove 132. One end portion 138 of the clamp lever 134 is held in engagement with one end of a spring 142 the other end of which bears on the bottom of the hole 140. With the above one end portion 138 biased by the spring 142, the other end portion 144 of the clamp lever 134 is normally held in pressed contact with the guide rail 108. In this arrangement, the secondary positioning member 110 is normally clamped to the guide rail 108. As indicated in FIG. 14, a cylinder 147 is provided to actuate an unclamping member 146 which is supported by a stationary member such as the base 74, such that the unclamping member 146 is movable in the Y-axis direction but not in the X-axis direction. The unclamping member 146 is adapted so as to abut on the previously-indicated on end portion 138 of the clamp lever 134 when the unclamping member 146 is advanced by the cylinder 147. As a result, the clamp lever 134 is pivoted by the unclamping member 146 against the biasing force of the spring 142, whereby the secondary positioning member 110 is unclamped with respect to the guide rail 108, and to the support plate 10. Thus, the secondary positioning member 110 is allowed to move in the X-axis direction. The free end of the unclamping lever 146 has substantially the same width as the groove 132, so that the free end may fit the groove 132 in the block 126. In this manner, therefore, the secondary positioning member 110 is held fixed in the X-axis direction by the unclamping lever 146. The block 126 has, at its bottom portion, a pair of flanges 148, 148 which extend in the opposite directions along the Y axis. In the meantime, a pair of retainer plates 150, 150 are attached to the upper surfaces of the guide rail 108. These retainer plates 150, 150 cooperate with the guide rail 108 to define a pair of guide grooves in which the flanges 148, 148 of the block 126 are slidably received to guide the block 126 along the X axis. In this arrangement, the block 126 is prevented from tilting when it is clamped to the guide rail 108 by the clamp lever 134. As indicated in FIG. 2, the support plate 10 has a cutout 152 in its front portion so as to accommodate a portion of the guide rail 108 on the Y-axis slide 82, and portions of the primary and secondary positioning members 106, 110, so that the previously described positioning pins 114, 128 are located at the rear of the stationary guide 14.

In the substrate positioning apparatus which is constructed as described hitherto, the previously indicated engagement member 66 is fixed to a suitable stationary member such as the base, such that the engagement member 66 is located at a predetermined position above the NC table 72, and is aligned with the movable guide 18. When the support plate 10 is elevated by the cylinder 96 to its upper position, the movable brackets 16, 16 are moved to their upper position in which the extensions 68, 68 of the engagement member 66 engages the engagement grooves 64, 64 in the movable brackets 16, 16. At the same time, the movement of the support plate 10 to its upper position causes the clamp levers 52, 52 in the movable brackets 16, 16 to be pivoted by the extensions 68, 68. In this manner, the movable brackets 16, 16 are fixed in position in the Y-axis direction, and at the same time the brackets 16, 16 are unclamped with respect to the support plate 10. In this condition, therefore, it is possible to move the support plate 10 in the Y-axis direction relative to the movable brackets 16, 16, by moving the Y-axis slide 82. Hence, for example, when it is desired to position a substrate 154 (FIGS. 2 and 4) which is smaller in size than the substrate 20, the Y-axis slide 82 is moved along the Y axis until the distance between the stationary and movable guides 14, 18 is reduced to a value corresponding to the Y-axis dimension of the small substrate 154, as indicated in two-dot chanin line in FIGS. 2 and 4. Thus, the stationary and movable guides 14, 18 can be readily and accurately moved relative to each other along the Y axis, whereby the distance between the two guides 14, 18 can be adjusted to a desired value that suits the Y-axis dimension of any substrates of different sizes.

Subsequently, the piston rod of the cylinder 96 is retracted to permit the support plate 10 to be lowered to its lower position under the biasing action of the spring 92. As a result, the engagement of the engagement grooves 64, 64 with the extensions 68, 68 is released, whereby the clamp levers 52 are pivoted to clamp the movable brackets 16, 16 to the support plate 10. In this embodiment, the cylinder 96, spring 92 and other components for moving the support plate 10 cooperate to constitute a first driving device for moving the movable brackets 16, 16 (first engagement member) and the extensions 68, 68 (second engagement member) relative to each other in the vertical directions, for effecting engagement of the first and second engagement members to hold the movable brackets 16, 16 fixed in position in the Y-axis direction. Further, this first driving device serves also as a second driving device for moving the extensions 68, 68 (unclamping member) and the clamp levers 52, 52 (clamp mechanism) relative to each other in the Y-axis direction, to cause the clamp mechanism to be brought into the unclamp position by the unclamping member. In connection with the adjustment of the Y-axis position of the movable guide 18, it is noted that the conveyer belts 40 and the guide plates 44 of the feed-in and feed-out devices 34, 36 are adapted to be moved relative to the opposite conveyer belts 38 and guide plates 42, to adjust the distance between the conveyer belts 38, 40 and the distance between the guide plates 42, 44, depending upon the Y-axis dimension of the substrate. More specifically, these distances may be changed by operating a handwheel 160 which are connected to one of a plurality of adjusting screws 160 (only one screw 160 for the feed-in device 34 is shown in FIG. 2) which are operatively connected to each other by a chain 156 and sprockets 158.

While the primary positioning member 106 to precisely position the substrate is always fixed in position irrespective of the size of the substrate, the secondary positioning member 110 is readily and accurately positioned at a suitable location along the X axis, which location is determined depending upon the X-axis dimension of the substrate. To adjust the position of the secondary positioning member 110, the X-axis slide 78 is first moved along the X axis so that the groove 132 in the secondary positioning member 110 is aligned with the unclamping member 146. Then, the cylinder 147 is activated to advance the unclamping member 147 into the groove 132, for pivoting the clamp lever 134 to unclamp the secondary positioning member 110 with respect to the guide rail 108, and for holding the secondary positioning member fixed in position in the X-axis direction. In this condition, the X-axis slide 78 is moved along the X axis to move the secondary positioning member 110 relative to the guide rail 108, i.e., relative to the support plate 10, for example, to the position indicated in two-dot chain line in FIG. 2, which corresponds to the X-axis dimension of the small substrate 154 previously indicated. Then, the unclamping member 146 is retracted for disengagement thereof from the groove 132 in the block 126, whereby the secondary positioning member 110 is again clamped to the guide rail 108 by the clamp lever 134. Thus, the secondary positioning member 110 is fixed in position in the X-axis direction, with respect to the support plate 10. As is apparent from the foregoing description, the unclamping member 146 serves as a fourth engagement member which is fixed in position in the X-axis direction and which engages the groove 132 to hold the secondary positioning member 110 fixed in the X-axis direction. Meanwhile, the block 126 having the groove 132 serves as a third engagement member engageable with the fourth engagement member 146. Further, the cylinder 147 for operating the unclamping member 146 in the Y-axis direction serves as a third driving device for moving the third and fourth engagement members relative to each other along the Y axis, to effect engagement of the third and fourth engagement members, for holding the secondary positioning member 110 fixed in the X-axis direction.

According to the illustrated embodiment of the substrate positioning apparatus of the invention, the Y-axis position of the movable guide 18 (Y-axis positioning member) and the X-axis position of the secondary positioning member (X-axis positioning member) can be changed to meet various sizes of a substrate to be handled, by utilizing accurate positioning capability of the NC table 72 the X and Y movements of which are precisely controlled by a numerical control unit. Therefore, the movable guide 18 and the secondary positioning member 110 can be positioned more rapidly and precisely, than the corresponding components in the conventional apparatus wherein the positioning of those components is made by the operator, directly by hand or by operating a screw-and-nut feed system or other mechanical means. Further, the movable guide 18 and the positioning member 110 can be operated in an automatic fashion, without an expensive additional drive unit for accurate positioning. Thus, the present substrate positioning system is accurate and efficient in operation, simple in construction, and available at a reduced cost.

Furthermore, the movable guide 18 and the secondary positioning member 110, which are movable relative to the support plate 10, can be clamped by the clamp levers 52 and the clamp lever 134, respectively, such that they are normally fixed in psotion in the Y-axis and X-axis directions, respectively. Therefore, the positions of the movable guide 18 and the secondary positioning member 110 relative to the support plate 10 will not be changed during movements of the NC table 72 for positioning the substrate in drilling holes therein or placing chips thereon. This means improved accuracy of positioning of the substrate. Since the clamp levers 52, 134 are automatically operated by the extensions 68, 68 and the unclamping member 146 into their unclamp position prior to changing the positions of the movable guide 18 and the secondary positioning member 110, it is not necessary to manually unclamp the movable brackets 16, 16 and the secondary positioning member 110. Namely, there is no possibility that these members 16, 16, 110 are left in their clamp position when they are moved relative to the support plate 10. Further, the unclamping members 68, 68 and 146 also serve as engagement members for holding the movable guide 18 (brackets 16, 16) and the secondary positioning member 110 at the predetermined Y-axis and X-axis positions, respectively, as previously described. Hence, the construction of the apparatus is further simplified.

In connection with the constructional simplicity of the instant substrate positioning apparatus, it is further noted that the driving device comprising the cylinder 96 and the spring 92 for operating the support plate 10 between its upper and lower positions is not provided exclusively for engagement of the engagement grooves 64, 64 with the extensions 68, 68. In other words, this driving device is absolutely necessary for elevating and lowering the support plate 10 for engagement and disengagement of the positioning pins 114, 128 with repsect to the positioning holes in the substrate, when the substrate is supplied to or discharged from the support plate 10 by means of the feed-in and feed-out devices 34, 36. In this sense, the engagement and disengagement of the engagement grooves 64 with respect to the extensions 68, 68 do not require an exclusive driving device, which would complicate the positioning apparatus.

While the present invention has been described in detail in its preferred embodiment referring to the drawings, it is to be understood that the invention may be otherwise embodied.

For example, while the illustrated embodiment is adapted to accurately position the substrate by both of the primary and second positioning members 106, 110 and to change the X-axis position of the secondary positioning member 110 to suit the size of the substrate, it is possible that the secondary positioning member is disposed near and in fixed relation with the right-hand side movable bracket 16 (in FIG. 2) so that the secondary positioning member may be moved in the Y-axis direction together with the movable brackets 16, that is, the Y-axis position of the secondary positioning member may be changed simultaneously when the position of the movable guide 18 is changed. Further, in the case where the Y-axis positioning of the substrate by the stationary and movable guides 14, 18 is sufficiently high, it is possible that the X-axis position of the substrate is established by using only one of the primary and secondary positioning members (X-axis positioning member).

Although the primary and second positioning members 106, 110 of the illustrated embodiment are disposed on the Y-axis slide 82 and their positioning pins 114, 128 are inserted into the positioning holes in the substrate to position the substrate in the X-axis direction as well as in the Y-axis direction, it is possible that the X-axis positioning of the substrate is effected by other suitable arrangements such as an X-axis positioning member which is adapted to abut on the side of the substrate parallel to the Y-axis. Further, the positioning members 106, 110 may be disposed on the support plate 10 or on the movable and stationary guides 14, 18, if the positioning pins 114, 128 are operated between their upper and lower positions by suitable cylinders, or if the substrate is placed on the support plate 10 after the substrate is once positioned above the support plate 10.

In the illustrated embodiment, the extensions 68, 68 of the engagement member 66 serves not only as the second engagement member engageable with the first engagement member 16, 16 for holding the movable guide 18 at a fixed Y-axis position, but also as the unclamping member for bringing the clamp levers 52 into their unclamp position. However, it is possible that the second engagement member and the unclamping member are provided as separate members. Similarly, the unclamping member 146 may be replaced by two separate members which serve, respectively, as the fourth engagement member for holding the secondary positioning member 110 at a fixed X-axis position, and as the unclamping member for bringing the clamp lever 134 to its unclamp position.

Although the illustrated embodiment uses the clamp levers 52, 134 for clamping the movable brackets 16, 16 and the secondary positioning member 110, it is possible to use other clamping means such as air cylinders. Further, such clamping means may be eliminated, if the frictio force between the movable brackets 16, 16 and the support plate 10, or between the secondary positioning member 110 and the guide rail 108, is so large that the brackets 16, 16 or the secondary positioning member are (is) not slidably movable relative to the support plate 10 or the guide rail 108.

Further, the engagement member 66 may be adapted to be movable in the vertical direction for effecting engagement of its extensions 68, 68 with the grooves 64, 64 in the movable brackets, rather than the support plate 10 is moved from its lower position to its upper position for the same purpose. Further, the unclamping member 146 as the fourth engagement member engageable with the groove 132 of the secondary positioning member, may be fixed in the Y-axis as well as in the X-axis direction. In this case, the engagement of the engagement member 146 with the groove 132 may be attained by moving the Y-axis slide 82 in the Y-axis direction.

Although the illustrated positioning apparatus is loaded and unloaded by means of the feed-in and feed-out devices 34, 36 of belt-conveyer type, in combination with loading and unload devices for transferring the substrate to and from the positioning apparatus, this conveyor and loading/unloading system may be replaced by other suitable systems. Furthermore, the automatic loading and unloading operations of the substrates by the loader and unloader arrangement may be replaced by manual loading and unloading operations by the operator who changes the substrate on the support plate 10, from one to another. In this instance, it is not necessary that the substrate holder for supporting the substrate on the support plate 10 be capable of guiding the substrate in the X-axis direction, like the substrate holder provided in the illustrated embodiment in the form of the stationary and movable guides 14, 18. Instead, the substrate holder is required merely to position the substrate in the Y axis direction by engagement thereof with the two sides of the substrate parallel to the X axis, before the substrate is held by the substrate holder.

It will be obvious that the present invention may be embodied with various other changes, modifications and improvements which may occur to those skilled in the art, without departing from the spirit of the invention.

What is claimed is:

1. A substrate positioning apparatus for positioning circuit substrates of different sizes of printed-wiring boards, comprising:
    an X-Y table having movable means movable along an X axis and a Y axis perpendicular to the X axis;
    a pair of Y-axis positioning members disposed on said movable means and spaced from each other in the Y-axis direction, at least one of said Y-axis positioning members being movable along said Y axis so that the Y-axis positioning members are movable toward and away from each other, said Y-axis positioning members being engageable with opposite parallel sides of the circuit substrate parallel to said X axis, thereby positioning the circuit substrate in the Y-axis direction;
    an X-axis positioning member provided on said movable means and engageable with the circuit substrate to position the substrate in the X-axis direction;
    a first engagement member provided on said at least one of the Y-axis positioning members;
    a second engagement member which is fixed in position in said X-axis direction; and
    a first driving device for moving said first and second engagement members relative to each other in a direction perpendicular to said Y axis, and for effecting engagement of said first and second engagement members with each other, to thereby hold said at least one Y-axis positioning member fixed in said Y-axis direction, and permit a change in relative position between said at least one Y-axis positioning member and said movable means in said Y-axis direction through a movement of said movable means in said Y-axis direction.

2. A substrate positioning apparatus according to claim 1, further comprising:
    a clamp mechanism provided on said at least one Y-axis positioning member, and operable between a clamp position in which said at least one Y-axis positioning member is fixed relative to said movable means, and an unclamp position in which said at least one Y-axis positioning member is unclamped, said clamp mechanism being normally placed in said clamp position;
    an unclamping member which is fixed in position in said Y-axis direction; and
    a second driving device for moving said unclamping member and said clamp mechanism relative to each other, to cause said clamp mechanism to be brought into said unclamp position by said unclamping member.

3. A substrate positioning apparatus according to claim 2, wherein said first driving device moves said first engagement member and said clamp mechanism together in said direction perpendicular to said Y axis, whereby said first driving device serves also as said second driving device.

4. A substrate positioning apparatus according to claim 2, wherein said second engagement member serves also as said unclamping member.

5. A substrate positioning apparatus according to claim 2, wherein said clamp mechanism comprises:
    a clamp lever pivotally supported by said at least one Y-axis positioning member, and including an operating portion which is engageable with said movable means in frictional contact with each other;
    a spring for biasing said clamp lever to normally hold said operating portion in contact with said movable means; and
    an actuator member which is operated through engagement thereof with said unclamping member, to pivot said clamp lever for moving said operating portion of the clamp lever away from said movable means against a biasing force of said spring.

6. A substrate positioning apparatus according to claim 1, wherein said second engagement means is fixed in position, and said movable means includes a support member which is movable relative to said X-Y table along a Z axis perpendicular to said X and Y axes, said support member supporting said pair of Y-axis positioning members, said first driving device elevating said supporting member toward said second engagement member to effect engagement of said first engagement member with said second engagement member.

7. A substrate positioning apparatus according to claim 1, wherein said X-axis positioning member is movable in said X-axis direction, and further comprising:
    a third engagement member provided on said X-axis positioning member;
    a fourth engagement member which is fixed in position in said X-axis direction; and
    a third driving device for moving said third and fourth engagement members relative to each other in a direction perpendicular to said X axis, and for effecting engagement of said third and fourth engagement members with each other, to thereby hold said X-axis positioning member fixed in said X-axis direction, and permit a change in relative position between said X-axis positioning member and said movable means in said X-axis direction through a movement of said movable means in said X-axis direction.

8. A substrate positioning apparatus according to claim 1, wherein said pair of Y-axis positioning members extend along said X axis and has a pair of guides for guiding the circuit substrate in said X-axis direction.

* * * * *